United States Patent [19]

Hayashi et al.

[11] Patent Number: 5,766,346

[45] Date of Patent: Jun. 16, 1998

[54] APPARATUS FOR PRODUCING SILICON SINGLE CRYSTAL

[75] Inventors: Toshirou Hayashi; Ryouji Hoshi; Izumi Fusegawa; Tomohiko Ohta, all of Nishishirakawa, Japan

[73] Assignee: Shin-Etsu Handotai Co., Ltd., Tokyo, Japan

[21] Appl. No.: 760,959

[22] Filed: Dec. 5, 1996

[30] Foreign Application Priority Data

Dec. 28, 1995 [JP] Japan .................... 7-352211

[51] Int. Cl.⁶ .................................... C39B 35/00
[52] U.S. Cl. .......................... 117/208; 117/200
[58] Field of Search ....................... 117/13, 14, 15, 117/27, 28, 29, 32, 200, 208

[56] References Cited

U.S. PATENT DOCUMENTS

| | | | |
|---|---|---|---|
| 4,830,703 | 5/1989 | Matsutani | 117/32 |
| 5,196,085 | 3/1993 | Szekely et al. | 117/32 |
| 5,306,387 | 4/1994 | Fusegawa et al. | 117/28 |
| 5,571,320 | 11/1996 | Grimes et al. | 117/32 |

FOREIGN PATENT DOCUMENTS

| | | |
|---|---|---|
| 0 499 471 A1 | 8/1992 | European Pat. Off. |
| A-63-297291 | 12/1988 | Japan |
| A-63-297292 | 12/1988 | Japan |
| A-64-42389 | 2/1989 | Japan |
| 2 136 310 | 9/1984 | United Kingdom |

OTHER PUBLICATIONS

"Magnetic Field Breeds Skylab–Like Semiconductor", Electrons, Jul. 3, 1980, p. 83.

*Primary Examiner*—Felisa Garrett
*Attorney, Agent, or Firm*—Oliff & Berridge, PLC

[57] ABSTRACT

An apparatus for producing a silicon single crystal by the MCZ method is disclosed in which electrodes and magnets are arranged so as to make such a condition that a line of magnetic force passing through the central axis of the crucible and a horizontal electric current which results from the supply of a direct current to the heater forms a counter-clockwise angle of more than 0° and less than 180° on the basis of the condition where the direction of the line of magnetic force coincides with the direction of the horizontal electric current.

6 Claims, 4 Drawing Sheets

5,766,346

1

APPARATUS FOR PRODUCING SILICON SINGLE CRYSTAL

TECHNICAL FIELD

The present invention relates to an apparatus for producing a silicon single crystal with applying a magnetic field. More particularly, the invention relates to an apparatus suitable for producing a silicon single crystal having a large diameter of 8 inches or more.

BACKGROUND OF THE INVENTION

Silicon single crystals which are used as a material of a substrate of a semiconductor device are produced mainly by the Czochralski method (hereinafter, referred to as the "CZ method"). Recently, the Magnetic-Field-Applied Czochralski method (hereinafter, referred to as the "MCZ method") has been also known, which is an improved method of the CZ method and in which a silicon single crystal is produced with suppressing thermal convection of silicon melt by applying a magnetic filed to the melt. In recent years, a demand for silicon single crystals having large diameters of 8 inches or more has been increased. The MCZ method which is capable for suppressing thermal convection of silicon melt is effective for producing such large diameter silicon single crystals.

The MCZ method is carried out with an apparatus shown in FIG. 4, for example. As shown in FIG. 4, in the apparatus, a rotating shaft 22 is inserted from the bottom portion of a chamber 21. On the upper end of the rotating shaft 22 is fixed a susceptor 23, by which a crucible 24 made of quartz glass is supported. The susceptor 23 is surrounded by a cylindrical graphite heater 25. Clamps 26, 26 are attached to the heater 25 at the lower end thereof. The heater 25 is connected to electrodes 27, 27', which are inserted from the bottom portion of the chamber 21, via the clamps 26, 26. The heater 25 is surrounded by a heat insulating cylinder 28. Outside of the chamber 21 are provided superconductive magnets 29, 29' which apply a magnetic field to silicon melt 30 in the crucible 24. A rotatable pulling shaft or wire 31 for pulling a single crystal is inserted from the ceiling portion of the chamber 21.

A single crystal is produced with the apparatus as follows:

Polycrystalline silicon material is filled in the crucible 24 and then a direct current is supplied to the heater 25 through the electrodes 27, 27' to melt the silicon material in the crucible and obtain the silicon melt 30. Then, while a horizontal magnetic field is applied to the silicon melt 30 by the superconductive magnets 29, 29', a seed crystal 32 which is attached to the end part of the pulling shaft or wire 31 is dipped into the silicon melt 30 and slowly pulled from the melt with rotating the rotating shaft 22 and the pulling shaft or wire 31, and as a result a silicon single crystal 34 is obtained.

In this apparatus, the cylindrical heater 25 has plurality of slits of one type which are formed from the upper end to the lower side of the heater and plurality of slits of another type which are formed from the lower end to the upper side of the heater, the former being alternately parallel to the latter. It is known that, since the electric current flows upward or downward through each segment divided by the slits, the force caused by the interaction between the electric current and the horizontal magnetic filed applied to the silicon melt acts on the heater and the force may turn the heater round. In order that the heater is not turned round by the force, various proposals, for example, the heater being fixed to the electrodes by bolts, have been made (see Japanese Patent

2

Application Laid-Open (KOKAI) 297291/1988, 297292/1988 and 42389/1989).

In order to produce a single crystal having a large diameter of 8 inches or more, in particular, 10 inches to 16 inches, the demand for which will be increased hereinafter, it is necessary to use a crucible having an inside diameter of 600 mm or more. Such a large crucible leads to an increase of electric power to be used for heating the melt in the crucible and an increase of the electric current flowing through the heater. Furthermore, in order to suppress thermal convection of the silicon melt caused in such a large crucible, it is necessary to apply a magnetic filed having high intensity to the melt. Therefore, in the pulling of a silicon single crystal having a large diameter of 8 inches or more, in which the electric current flowing the heater is increased and the magnetic field having high intensity is applied to the melt, the force caused by the interaction between the magnetic field and the electric current is increased, so that the increased force acts on the heater. As a result, a new problem occurs which did not matter heretofore. That is, the force which makes the heater rise upwardly acts on the heater, so that such troubles as electric discharge or, if the heater is fixed to the electrodes by bolts to prevent the heater rising upwardly, the breakage of the fixing part occur.

The present invention is made in view of the foregoing, and therefore an object of the present invention is to provide an apparatus for producing a single crystal which does not cause such problems as heater rising upwardly, etc., even if a magnetic field having high intensity is applied.

SUMMARY OF THE INVENTION

The present invention is based upon the discovery that, when a direct current flows through the heater, a horizontal electric current flows from the anode side to the cathode side, apart from the current actually flowing upward or downward through each segment of the heater, and as a result an upward force is caused by the interaction between the horizontal current and the magnetic field applied to the melt, which force acts on the heater, therefore the phenomenon of the heater rising upwardly presents itself.

According to the present invention, it is provided an apparatus for producing a silicon single crystal comprising a rotatable crucible for accommodating a silicon melt, a heater which surrounds the crucible, electrodes for supplying a direct current to the heater, magnets for applying a horizontal magnetic field to the silicon melt accommodated in the crucible, and a rotatable pulling member for pulling a single crystal from the silicon melt, the electrodes and the magnets being arranged so as to make such a condition that a line of magnetic force passing through the central axis of the crucible and a horizontal electric current which results from the supply of a direct current to the heater forms a counter-clockwise angle of more than 0° and less than 180° on the basis of the condition where the direction of the line of magnetic force coincides with the direction of the horizontal electric current.

If the electrodes and the magnets are arranged in such a manner, a downward force is always caused by the interaction between the horizontal electric current and the magnetic field, which force acts on the heater as a whole, so that such troubles as the heater rising phenomenon, etc. can be avoided, and the electric discharge does not occur. Therefore, according to the apparatus, a single crystal having a large diameter can be produced with high qualities and high yield.

The apparatus according to the present invention is preferably provided with one or more supporting bodies which are insulated and support the heater. In the apparatus, the downward force acts on the heater, in particular, in pulling of a single crystal having a large diameter by using a large graphite heater, the weight of the heater itself is large in addition to the downward force acting on the heater, and the graphite heater has only low mechanical strength. Therefore, it is advisable to prevent the heater from being broken by using the supporting body or bodies in the apparatus.

The apparatus according to the present invention is in particular suitable in case where a single crystal having a large diameter of 8 to 16 inches is to be produced, or, the crucible has an inside diameter of 600 mm or more. The apparatus is in particular effective in case where the intensity of the magnetic field which is horizontally applied to the melt is 2000 gausses or more at the central axis of the crucible, and/or, the direct current supplied to the heater is 2000 amperes or more.

The production of a silicon single crystal having a large diameter of 8 inches or more, in particular 10 to 16 inches, the demand for which will be increased for the future, needs a crucible having an inside diameter of 600 mm or more and the supply of an electric current of 2000 amperes or more. Furthermore, in order to suppress thermal convection of the silicon melt caused in such a large inside diameter crucible, a magnetic field of high intensity of 2000 gausses or more should be applied to the silicon melt. Therefore, in pulling of a silicon single crystal having a large diameter of 8 inches or more which needs a large current and a high intensity magnetic field, the above-described force caused by interaction between the magnetic field and the electric current which makes the heater rise upwardly is too large in the conventional apparatus. This is the reason why the apparatus of the present invention is in particular suitable or effective in the above mentioned cases.

According to the apparatus of the present invention, in case where a silicon single crystal having a large diameter of 8 inches or more is produced by the MCZ method, the downward force acts on the heater during operation, so that if the intensity of the applied magnetic field is 2000 gausses or more and the supplied electric current is 2000 amperes or more, the phenomenon of the heater rising upwardly does not present itself which means no danger of electric discharge. Therefore, the apparatus of the present invention also has the advantage that it is not necessary to fix the heater to the electrodes by bolts.

BRIEF DESCRIPTION OF THE DRAWINGS

For a better understanding of the present invention as well as other objects and features thereof, reference is made to the following detailed description to be read in conjunction with the accompanying drawings, wherein.

DETAILED DESCRIPTION OF THE INVENTION

The present invention will be described in further detail with reference to the accompanying drawings, and is not limited to the description.

Figure 1A:
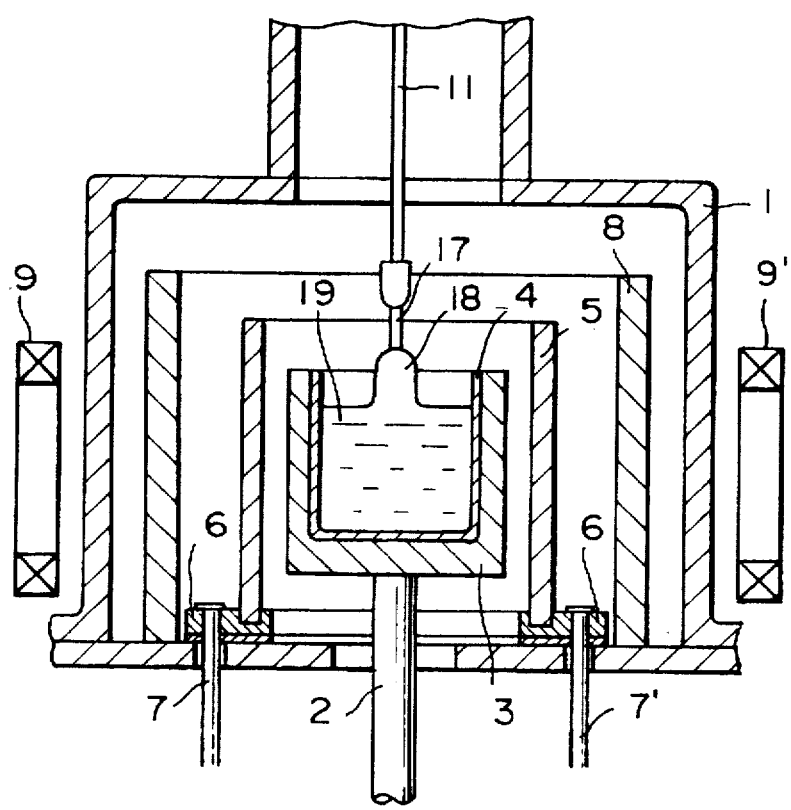
FIG. 1A is a schematic sectional view of a typical apparatus for producing a silicon single crystal by the MCZ method according to the present invention and FIG. 1B is a plane view showing an example of arrangements of a heater, electrodes, magnets and supporting bodies in the apparatus according to the present invention.
Figure 1B:
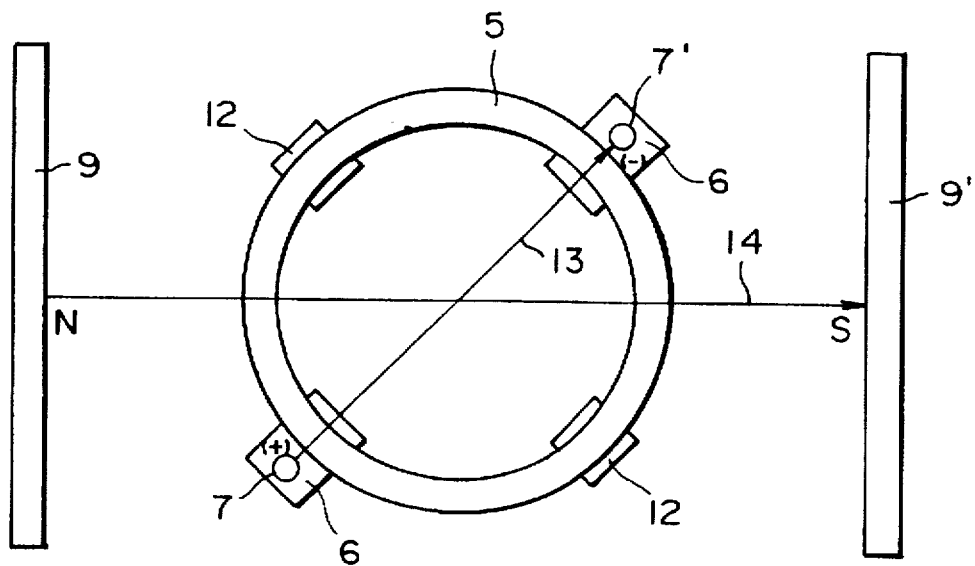
Figure 4:
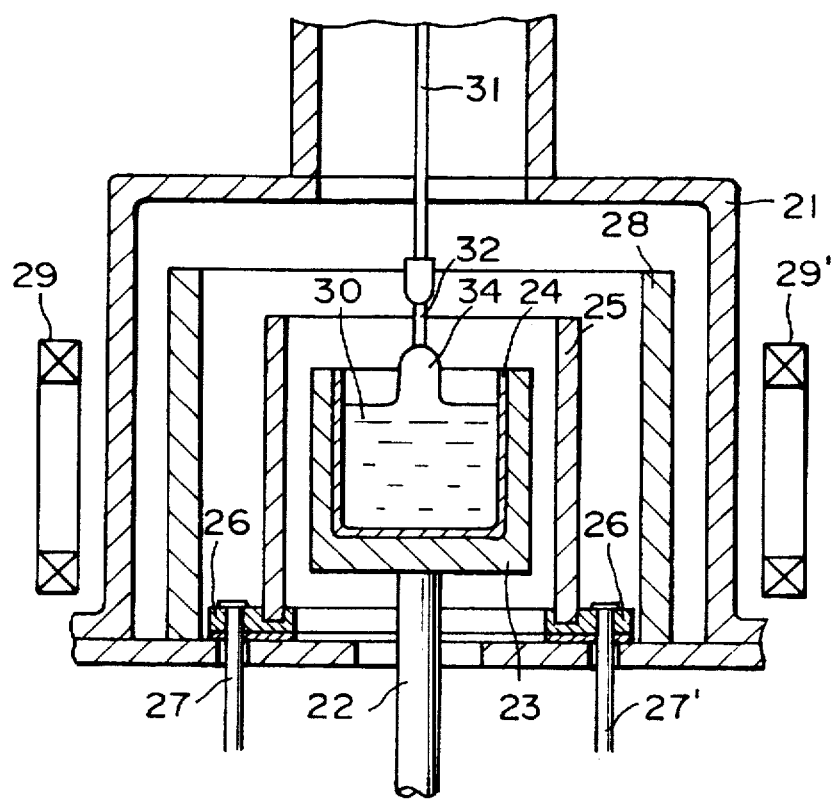
FIG. 4 is a schematic sectional view of a conventional apparatus for producing a silicon single crystal by the MCZ method.

A schematic structure of a typical apparatus of a silicon single crystal according to the present invention is shown in FIGS. 1A and 1B. As shown in FIGS. 1A and 1B, the schematic structure of the apparatus is the same as that of the conventional apparatus shown in FIG. 4, except for the position of electrodes and the presence of supporting bodies. That is, a rotating shaft 2 is inserted from the bottom portion of a chamber 1. On the upper end of the rotating shaft 2 is fixed a susceptor 3, by which a crucible 4 is supported. In the crucible 4, a silicon melt 19 is accommodated. The susceptor 3 is surrounded by a heater 5. Clamps 6, 6 are attached to the heater 5 at the lower end thereof. The heater 5 is connected to electrodes 7, 7', the numeral 7 showing an anode and the numeral 7' showing a cathode, which are inserted from the bottom portion of the chamber 1, via the clamps 6, 6. The heater 5 is surrounded by a heat insulating cylinder 8. Outside of the chamber 1 are provided superconductive magnets 9, 9' which apply a horizontal magnetic field to the silicon melt 19 in the crucible 4. A rotatable pulling member 11 for pulling a single crystal 18, such as a rotatable pulling shaft or wire, is inserted from the ceiling portion of the chamber 1. A seed crystal 17 is attached to the end part of the pulling member 11.

In the apparatus, a silicon single crystal 18 is produced by dipping the seed crystal 17 into the silicon melt 19 and pulling it from the melt with applying a horizontal magnetic field to the melt and rotating the rotating shaft 2 and the pulling member 11.

FIG. 1B is a plane view showing an example of the arrangements of the heater 5, the electrodes 7, 7', the magnets 9, 9' and supporting bodies 12, 12 in the apparatus for producing a silicon single crystal according to the present invention. In FIG. 1B, the arrow 13 shows a direction of a horizontal electric current flowing when a direct current is supplied to the heater 5 and the arrow 14 shows a direction of a line of magnetic force passing through the central axis of the crucible. In FIG. 1B, the electrodes and the magnets are arranged so as to make such a condition that a line of magnetic force passing through the central axis of the crucible and a horizontal electric current which results from the supply of a direct current to the heater forms a counterclockwise angle of 30° on the basis of the condition where the direction of the line of magnetic force coincides with the direction of the horizontal electric current.

The crucible 4 for accommodating the silicon melt 19 is in general made of quarts glass. In a conventional apparatus, a crucible having the inside diameter of 10 to 18 inches (about 250 to 450 mm) is used, but in the present apparatus a crucible having the inside diameter of 20 inches (about 500 mm) or more is used which is suitable for producing a silicon single crystal having a diameter of 8 inches or more, and in addition a crucible having the inside diameter of 24 inches (about 600 mm) or more is also used which is suitable for producing a silicon single crystal having a diameter of 10 inches or more.

The heater 5 is in general cylindrical and made of graphite. The heater 5 has plurality of slits of one type which are formed from the upper end to the lower side of the heater and plurality of slits of another type which are formed from the lower end to the upper side of the heater, the former being alternately parallel to the latter and they forming segments.

In a conventional apparatus, an electric current of less than 2000 amperes is supplied to the heater 5, but in the present apparatus an electric current of 2000 amperes or more is supplied which is required for producing a silicon single crystal having a diameter of 8 inches or more.

The magnets 9, 9' for applying a horizontal magnetic filed to the silicon melt in the crucible is in general superconductive coils. In a conventional apparatus, a magnetic field having a intensity at the central axis of the heater ranging from hundreds up to less than 2000 gausses is applied, but in the present apparatus a magnetic field having the intensity of 2000 gausses or more is applied which is required for efficiently controlling thermal convection caused in the silicon melt in pulling of a silicon single crystal having a diameter of 8 inches or more.

In the apparatus of the present invention, the electrodes 7, 7' and the magnets 9, 9' are arranged so that a downward force acts on the heater during operation. Concretely, they are arranged so as to make such a condition that a line of magnetic force passing through the central axis of the crucible and a horizontal electric current which results from the supply of a direct current to the heater forms a counterclockwise angle of more than 0° and less than 180° on the basis of the condition where the direction of the line of magnetic force coincides with the direction of the horizontal electric current. If they are arranged in this manner, a downward force acts on the heater during operation according to the Fleming's left-hand rule, so that the heater rising upwardly can be avoided and thus electric discharge does not occur.

Figure 2:
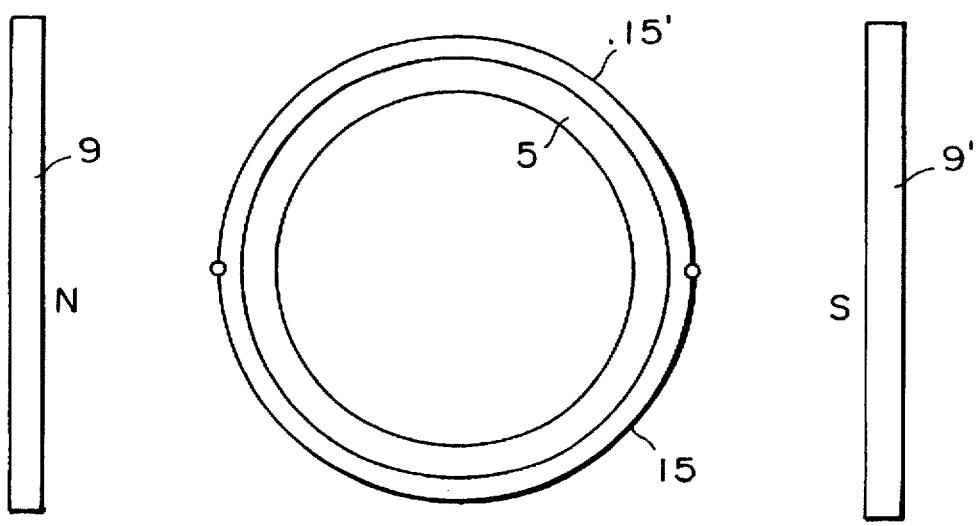
FIG. 2 shows the possible arrangements of electrodes and magnets in an apparatus according to the present invention.

FIG. 2 shows the positions capable of arranging the electrodes and the magnets in the apparatus of the present invention. In FIG. 2, a line 15 shows the positions capable of arranging the anode 7 and a line 15' shows the positions capable of arranging the cathode 7'.

In the apparatus, the counterclockwise angle is preferably 30° to 150°. The current density is largest at the portions of the segments connected to the electrodes and the intensity of the magnetic field is higher at positions nearer to the magnets. Therefore, in case of the counterclockwise angel being less than 30° or more than 150°, the force which is caused by the interaction between the electric current flowing upward or downward through the segments connected to the electrodes and the horizontal magnetic field applied to the silicon melt and which may turn the heater round is too larger. Such too larger force may cause the change of the shape and in some cases the breakage of the heater at a high possibility. For that reason, it is preferable that the electrodes is apart from the magnets as far as possible.

In a preferred embodiment of the apparatus according to the present invention are provided one or more supporting bodies 12 which are insulated and support the heater 5. The heater 5 is in general made of graphite having only low mechanical strength and in addition has plurality of slits, so that the heater is fragile by the downward force. In particular, in the production of a crystal having a large diameter, a heater to be used is also larger in diameter and the weight itself is increased, so that the possibility of breakage of the heater is increased. Therefore, it is preferable that the heater on which the downward force acts is supported not only by the electrodes but also by the supporting bodies. In particular, in case where a magnetic field having high intensity of 2000 gausses or more at the central axis of the crucible is applied to the melt and a large current of 2000 amperes or more is supplied to the heater in order to produce a silicon single crystal having a large diameter of 8 inches or more, the presence of the supporting body or bodies is useful for preventing the heater from being broken in operation. The number of the supporting bodies is not limited, but it is preferable to symmetrically install the plural number, in particular, an even number of the supporting bodies. The supporting body is made of an insulating material, preferable ceramics such as silicon carbide, silicon nitride, alumina, etc.

The invention will be more clearly understood with reference to the following examples but is not limited to them.

EXAMPLE 1

Figure 3A:
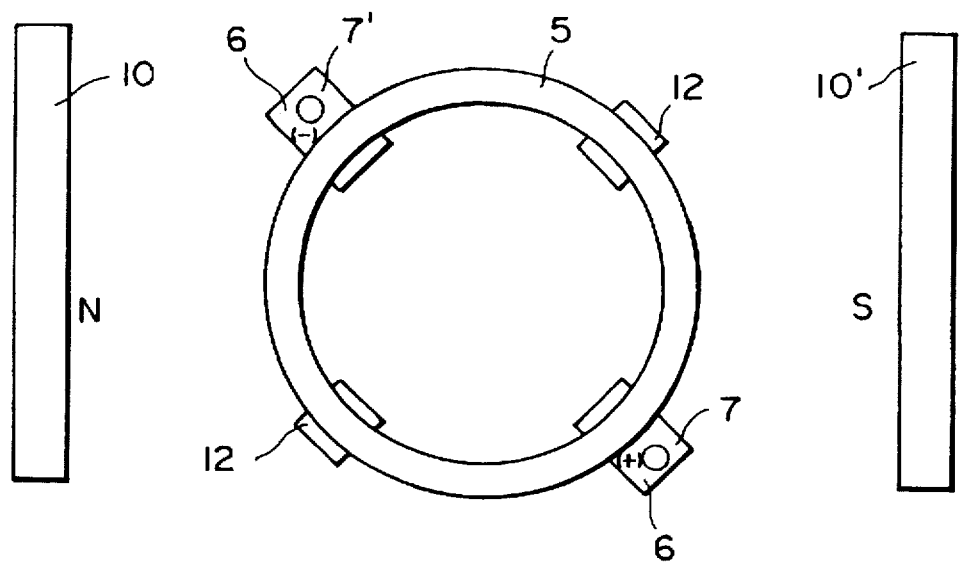
FIGS. 3A and 3B are plane views showing the arrangements of a heater, electrodes and superconductive coils in Example 1 and Comparative Example 1, respectively.

In an apparatus for producing a silicon single crystal by the MCZ method, the electrodes and the superconductive coils were arranged so as to make such a condition that a line of magnetic force passing through the central axis of the crucible and a horizontal electric current which results from the supply of a direct current to the heater forms a counterclockwise angle of 150° on the basis of the condition where the direction of the line of magnetic force coincides with the direction of the horizontal electric current. In addition, two supporting bodies were installed so that the line drawn between the supporting bodies and the line drawn between the electrodes were crossed at right angles. FIG. 3A shows the arrangement of the heater 5, the electrodes 7, 7', the superconductive coils 10, 10' and the supporting bodies 12, 12 in this case.

The graphite heater and the electrodes were connected via the clumps. The heater was inserted into the clamps 6, 6 via the tapering portions of the heater and in contact with the clamps by the weight of the heater itself. The heater was not fixed to the clamps by bolts, etc.

Into the quartz crucible having an inside diameter of 600 mm was placed 150 kg of polycrystalline silicon material and the material in the crucible was melt by supplying a direct current of 3500 amperes to the graphite heater through the electrodes, by which silicon melt was obtained.

To the silicon melt was applied a horizontal magnetic field so that the maximum intensity of the magnetic field at the central axis of the crucible was 4000 gausses. At this time, the magnetic field of about 2000 to 6000 gausses was applied to the heater.

A silicon single crystal having a diameter of 8 inches was pulled under a magnetic field having high intensity and a large electric current as described above. In operation, no accident occurred in the apparatus and thus a silicon single crystal having a large diameter of 8 inches could be produced without any problems. This result shows that the apparatus according to the present invention can solve the problem of the heater rising upwardly.

Comparative Example 1

Figure 3B:
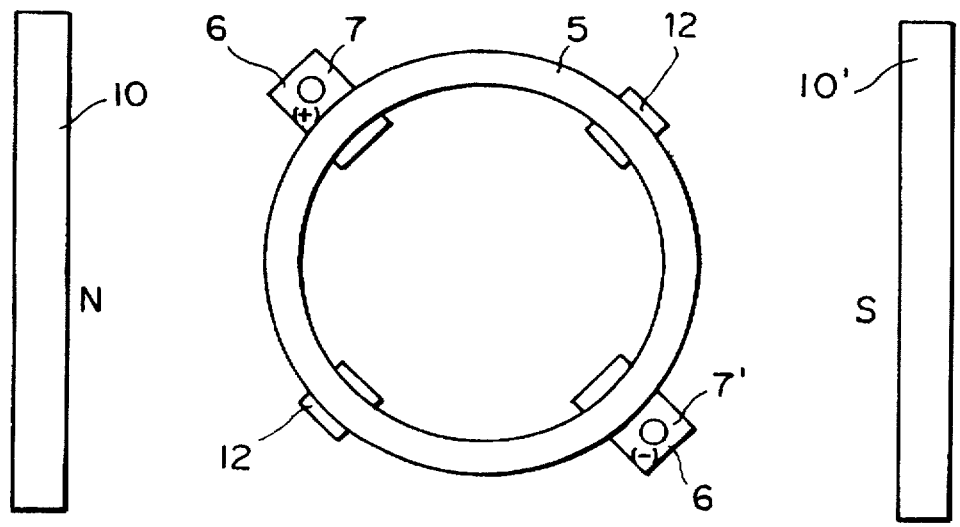

The apparatus similar to the apparatus used in Example 1 was used, except that the electrodes and the superconductive coils were arranged so as to make such a condition that a line of magnetic force passing through the central axis of the crucible and a horizontal electric current which results from the supply of a direct current to the heater forms a clockwise angle of 30° (a counterclockwise angle of 330°) on the basis of the condition where the direction of the line of magnetic force coincides with the direction of the horizontal electric current. FIG. 3B shows the arrangement of the heater 5, the electrodes 7, 7', the superconductive coils 10, 10'and the supporting bodies 12, 12 in this case.

Once the magnetic field having high intensity was applied to the silicon melt as in Example 1, the heater rose and electric discharge occurred, and as a result it was not possible to continue the pulling of the crystal.

What is claimed is:

1. An apparatus for producing a silicon single crystal comprising a rotatable crucible for accommodating a silicon melt, a heater which surrounds the crucible, electrodes for supplying a direct current to the heater, magnets for applying a horizontal magnetic field to the silicon melt accommodated in the crucible, and a rotatable pulling member for pulling a single crystal from the silicon melt, said electrodes and said magnets being arranged so as to make such a condition that a line of magnetic force passing through the central axis of said crucible and a horizontal electric current which results from the supply of a direct current to said heater forms a counter-clockwise angle of more than 0° and less than 180° on the basis of the condition where the direction of the line of magnetic force coincides with the direction of the horizontal electric current.

2. The apparatus according to claim 1, wherein at least one supporting body which is insulated and support said heater is further provided.

3. The apparatus according to claim 1, wherein said silicon single crystal to be pulled from said silicon melt has a diameter ranging from 8 inches up to 16 inches.

4. The apparatus according to claim 1, wherein the intensity of the horizontal magnetic field applied to said melt is at least 2000 gausses at the central axis of said crucible.

5. The apparatus according to claim 1, wherein said crucible has an inside diameter of at least 600 mm.

6. The apparatus according to claim 1, wherein the direct current supplied to said heater is at least 2000 amperes.

* * * * *